United States Patent [19]
Fujimoro et al.

[11] Patent Number: 5,343,085
[45] Date of Patent: Aug. 30, 1994

[54] POWER-ON RESET SYSTEM AND A SEMICONDUCTOR MEMORY DEVICE INCORPORATING SAME

[75] Inventors: Takuya Fujimoro, Kawasaki; Yukio Wada, Yokohama, both of Japan

[73] Assignee: Kabushiki Kaisha Toshiba, Kawasaki, Japan

[21] Appl. No.: 44,172

[22] Filed: Apr. 8, 1993

[30] Foreign Application Priority Data

Apr. 9, 1992 [JP] Japan .................. 4-088600

[51] Int. Cl.⁵ .................................. H03K 17/28
[52] U.S. Cl. .................. 307/272.3; 307/603; 328/129.1; 377/20
[58] Field of Search ............... 307/603, 273, 272.3, 307/272.2, 272.1; 328/129.1; 377/20

[56] References Cited

U.S. PATENT DOCUMENTS

| | | | |
|---|---|---|---|
| 3,532,993 | 10/1970 | Kennedy | 307/273 |
| 3,742,257 | 6/1973 | Wittenzelner | 307/273 |
| 4,001,608 | 1/1977 | Zuk | 307/273 |
| 4,134,027 | 1/1979 | Scott et al. | 328/129.1 |
| 4,825,407 | 4/1989 | Loessel et al. | 307/603 |
| 5,086,237 | 2/1992 | Matsumoto | 307/273 |

*Primary Examiner*—Timothy P. Callahan
*Assistant Examiner*—My-Trang Nu Ton
*Attorney, Agent, or Firm*—Finnegan, Henderson, Farabow, Garrett & Dunner

[57] ABSTRACT

A power-on reset system comprises one-shot pulse generator for generating a one-shot pulse signal in response to a change in the power supply potential, a flip-flop to be set to operate by a one shot pulse signal and a timer to be activated by an output signal of said flip-flop operating as an enable signal for timing a given period of time. An output signal of said timer operates to reset the flip-flop so that the output of said flip-flop is utilized as a system reset signal. The timer includes an oscillator and a counter for counting oscillation signals. A voltage step-up means has an input responsive to the oscillation signals. With such an arrangement, the overall surface area of an LSI incorporating the system is minimized and a sufficiently long reset period is ensured for it.

12 Claims, 3 Drawing Sheets

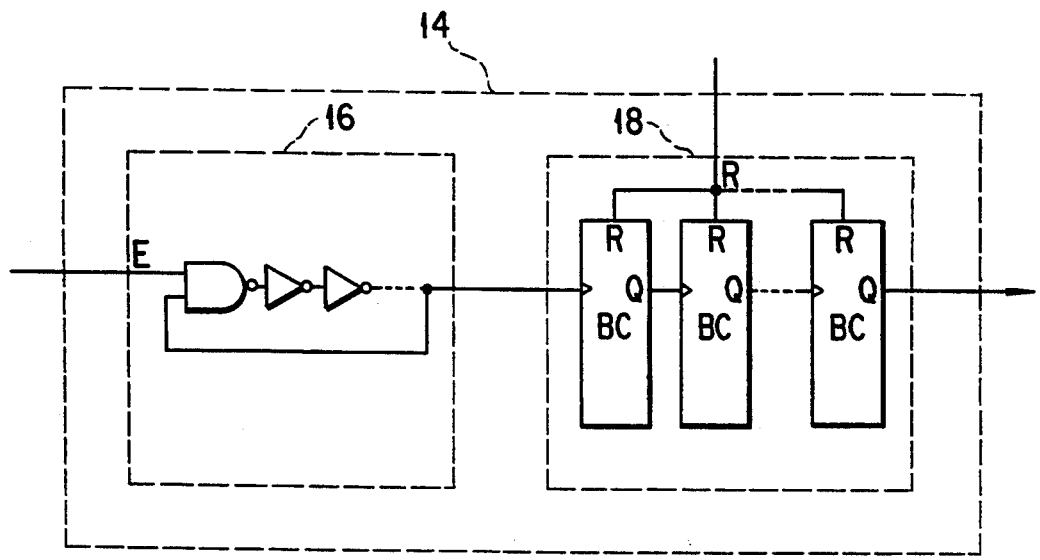
F I G. 4
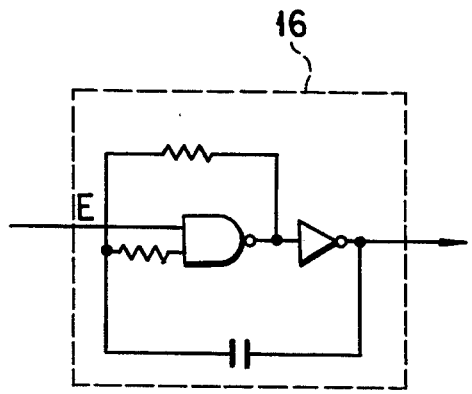
F I G. 5
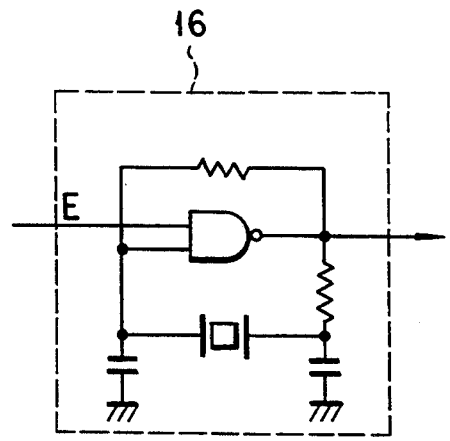
F I G. 6

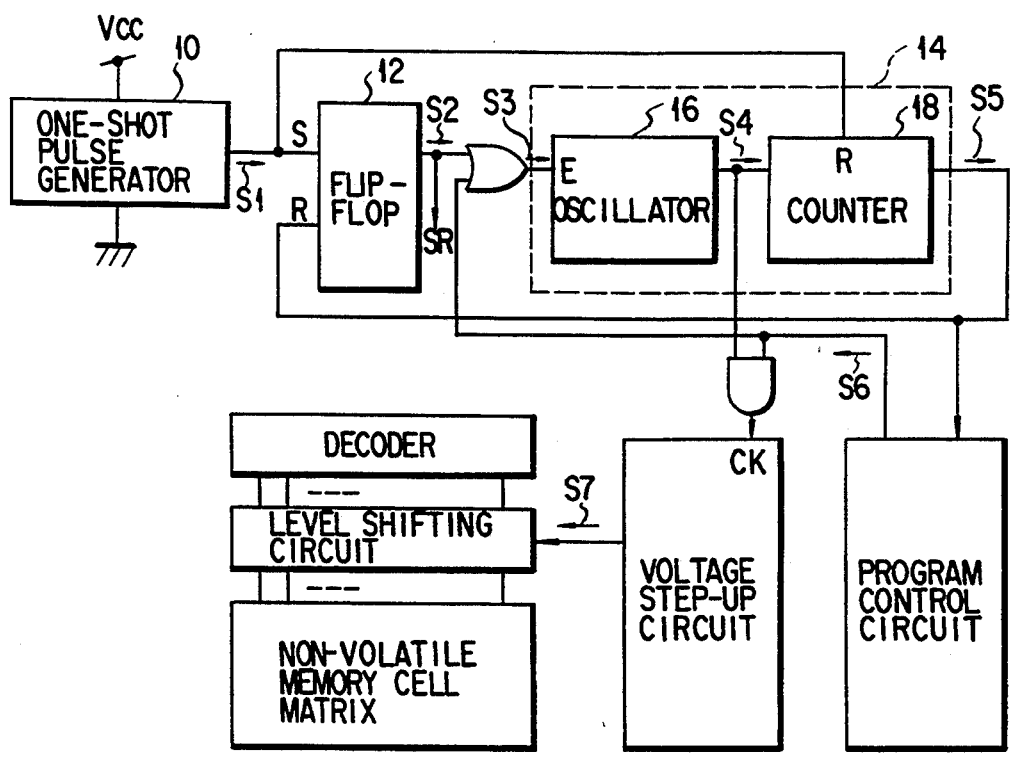
F I G. 7

POWER-ON RESET SYSTEM AND A SEMICONDUCTOR MEMORY DEVICE INCORPORATING SAME

BACKGROUND OF THE INVENTION

1. Field of the Invention

This invention relates to a power-on reset system for automatically generating a reset signal when electric power is applied to an LSI.

2. Description of the Related Art

FIG. 8 of the accompanying drawings illustrates a circuit diagram of a typical power-on reset circuit and FIG. 9 is a timing chart for such a circuit.

As shown in FIG. 8, a resistor r and a capacitor c are connected in series between a terminal for power supply voltage VCC and a ground terminal GND, and the input terminal of an inverter is connected to interconnection node A of the devices.

When a power supply voltage is applied to a power-on reset circuit having such a configuration, the node A is electrically charged to show a potential equal to that of the power supply by way of the resistor r. The time required for the charge is a function of the product of the resistance of the resistor r and the capacitance of the capacitor c (time constant). A system reset signal is generated when the potential of node B which is connected to the output terminal of the inverter gets to a predetermined level.

Referring to the timing chart of FIG. 9, as the power supply voltage VCC goes up, the potential of the node A is raised. However, the potential of the node A is level "H" until the potential of the node A reaches a threshold level of the inverter 100. As the potential of the node A goes beyond the threshold level, the potential of the node B is turned to level "L". The period of time during which the node B is set to level "H" is defined as a reset period.

Now, in order to achieve a long reset period with a power-on reset circuit having a configuration as described above, the rise in potential of the node A needs to take place very slowly. This by turn requires a large resistance for the resistor r and a large capacitance for the capacitor c to realize a large time constant, meaning that a physically large resistor r and also a physically large capacitor c having a large surface area need to be used for the circuit to consequently increase the size of the LSI incorporating such a reset circuit. In short, the reset period of the reset circuit incorporated in an LSI of the type under consideration depends on the surface area of the device.

Thus, any known conventional power-on reset circuit is inevitably accompanied by the problem of increase in the size of the LSI incorporating it if the reset period of the circuit is made sufficiently long.

SUMMARY OF THE INVENTION

In view of the above described circumstances, it is, therefore, an object of the present invention to provide a power on reset system that ensures a sufficient long reset period while minimizing the surface area of the LSI incorporating the circuit.

To achieve the object of the present invention, a semiconductor memory device provided with a power-on reset system comprises a flip-flop having a set input for receiving a set signal when a power supply voltage is initially supplied to the device, reset input, and a flip-flop output; oscillation means, having an enable input, for generating oscillation signals; counter means for sending a count-end signal to the reset input when the number of oscillation signals reaches a given number; voltage step-up means having an input responsive to the count-end signal, for generating an enable signal to write data into a memory cell of the device; a memory cell matrix; a decoder for transmitting a decoded signal; means coupled to the output of the voltage step-up means for shifting the level of the decoded signal and sending a shifted signal to the memory cell matrix; a first logic gate for forwarding the oscillation signals from the oscillation means to the voltage step-up means upon receiving the enable signal; and a second logic gate having a first input responsive to the flip-flop output, a second input responsive to the enable signal from the control means, and an output coupled to the enable input of the oscillation means.

Preferably, said timer means is provided with an oscillation means for generating oscillation signals and a counter means for counting the generated oscillation signals. Preferably, said counter means comprises a reset-input terminal, the output terminal of a one-shot pulse generating means connected to the power supply being connected to said reset-input terminal of said counter means, said counter means being reset or released from a reset condition by an output of said one-shot pulse generating means. Preferably, said reset-input terminal of said counter means and said set-input terminal of said flip-flop are connected in parallel to the output terminal of said one-shot pulse generating means.

With a power-on reset system having a configuration as described above, after having been energized, a one-shot pulse signal is generated by the one-shot pulse generating means and used as a trigger to set the flip flop ready for operation. Then, upon receiving an output of flip flop, the timer means is activated to start timing a given period of time. When the given period of time has elapsed, the timer means transmits an output to the flip flop as a reset signal. This inverts the output of the flip-flop to deactivate the counter means. The system reset signal is extracted by the output of said flip-flop to ensure a system reset period which is equivalent to the period between the time when the flip-flop is set and the time when it is reset. Thus, with such an arrangement, a relatively long reset period can be obtained without selecting a large time constant for the resistor-capacitor circuit (R-C circuit).

Therefore, according to the present invention, there is provided a power-on reset system that can minimize the surface area of the LSI chip incorporating it and ensure a sufficiently long reset period.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 4 is a detailed block diagram of the timer means of the embodiment of FIG. 1;

FIG. 5 is a block diagram of an alternative oscillator that can replace the oscillator of the timer means of FIG. 3;

FIG. 6 is a block diagram of still another alternative oscillator that can replace the oscillator of the timer means of FIG. 3;

FIG. 7 is a block diagram of a non-volatile semiconductor memory device incorporating a power-on reset system according to the invention;

DETAILED DESCRIPTION OF THE PREFERRED EMBODIMENTS

Figure 1:
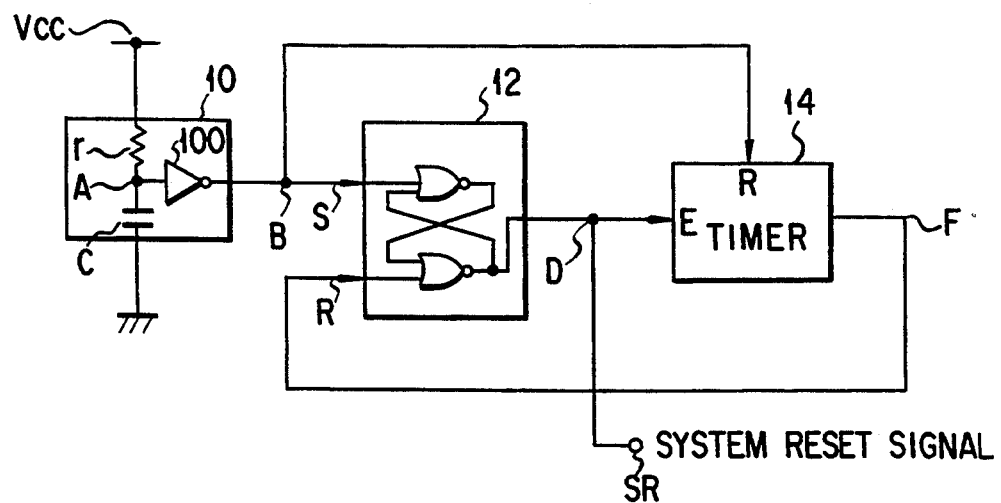
FIG. 1 is a block diagram of an embodiment of power-on reset system according to the invention.

The embodiment of FIG. 1 is incorporated in an LSI formed on a semiconductor substrate. Referring to FIG. 1, a one shot pulse generator 10 is inserted between a terminal for power supply voltage VCC and a ground terminal GND. The one-shot pulse generator 10 comprises a R-C circuit where a resistor r and a capacitor c are connected in series and an inverter 100 connected to the interconnection node A of the capacitor c and the resistor r. The output terminal of the one-shot pulse generator 10 is connected to the set-input terminal S of a flip-flop 12 (hereinafter referred to as FF 12) and, at the same time, branched at node B and connected to the reset-input terminal R of a timer 14. The output terminal of the FF 12 is connected to the enable-input terminal E of the timer 14 and, at the same time, branched at node D and connected to an extraction terminal SR to draw out a system reset signal. The output terminal of the timer 14 is connected to the reset-input terminal R of the FF 12.

Figure 2:
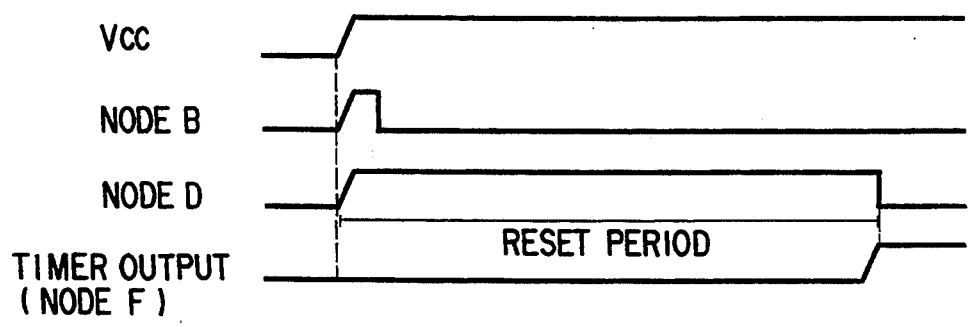
FIG. 2 is a timing chart for the circuit of FIG. 1.

Now, the operation of a power-on reset system having a configuration as explained above will be described by referring to the timing chart of FIG. 2.

As the LSI is energized, the electric potential of the node A rises in accordance with the rising potential of the power supply voltage VCC. The potential of the node B, i.e., that of the output terminal of the generator 10, remains at level "H" until the potential of the node A exceeds a threshold value for the inverter 100. The output is fed to the set-input terminal S of the FF 12 and also to the reset-input terminal R of the timer 14 so that the timer 14 is reset while the FF 12 is set.

The FF 12 which is set for operation transmits an output signal to raise the potential of the node D to level "H" and the raised potential is fed to the enable-input terminal E of the timer 14. On the other hand, once the potential of the node A exceeds the threshold value of the inverter 100, the potential of the node B is turned to level "L" (which corresponds to the reset period of the conventional) and the reset condition of the timer 14 is cleared. Then, the timer 14 accepts the level "H" signal through the enable-input terminal E to start timing a given period of time.

When the given period of time has elapsed, the timer 14 transmits an output signal to turn the output node F to level "H". This "H" level signal is fed to the reset-input terminal R of the FF 12 as a reset signal. Upon receiving the signal, the FF 12 turns the node D to level "L". The system reset signal is drawn out at the node D and the period between the setting and resetting operations of the FF 12 is used as a reset period for the system.

With a power on reset system having an abovedescribed configuration, the one-shot pulse signal of the R-C circuit is not directly used as a signal for defining a reset period. Rather, the one-shot pulse signal is used as a signal for setting the FF 12 for operation. The output of the FF 12 is reset by the output of the timer 14 after a given period of time is timed by the timer 14. Thus, a relatively long reset is guaranteed because the period between the setting and resetting operation of FF 12 is used as a reset period for the system. The reset period can be modified by changing the period of time to be timed by the timer 14.

In the embodiment shown in FIG. 1, the output terminal of the one-shot pulse generator 10 is connected to the set-input terminal S of the FF 12 and to the reset-input terminal R of the timer 14. This configuration is conceived such that the FF 12 is set for operation by using the level "H" of the potential of the node B while the timer 14 is set and reset by using inversion in the potential of the node B. Instead, the FF 12 may be set for operation directly by the power supply voltage VCC without using the output of the oneshot pulse generator 10. The timer 14 may be set and reset by a reset circuit arranged in itself without using the output of the generator 10.

Figure 3:
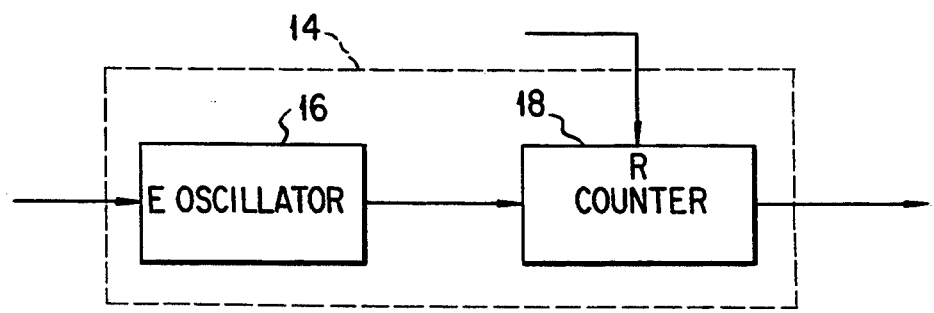
FIG. 3 is a simplified block diagram of the timer means of the embodiment of FIG. 1.
Figure 8:
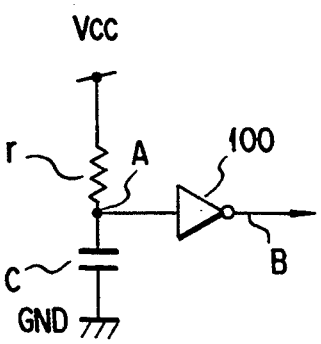
FIG. 8 is a block diagram of a conventional power-on reset circuit.
Figure 9:
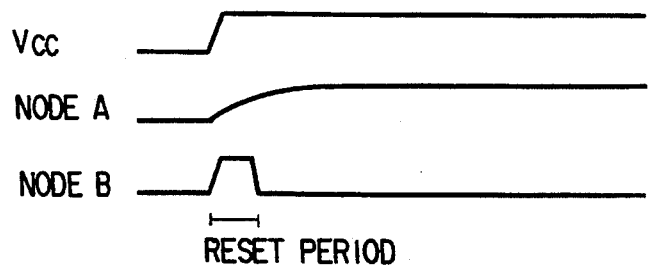
FIG. 9 is a timing chart for the circuit of FIG. 8.

FIG. 3 is a simplified block diagram of the timer 14 of the embodiment of FIG. 1.

Referring to FIG. 3, the output terminal of the FF 12 (not shown) is connected to the input terminal E of an oscillator 16. The oscillator 16 starts oscillating when it receives an output signal from the FF 12. The output terminal of the oscillator 16 is connected to the input terminal of the counter 18. The counter 18 is reset by an output signal of the one-shot pulse generator 10 (not shown) and, after the reset condition is cleared, counts any output oscillation signals of the oscillator 16 it receives. When the count of the counter 18 reaches a given number, it transmits an output signal. The output signal is fed to the reset-input terminal of the FF 12 (not shown) to invert the output of the FF 12. Upon receiving a signal representing the inversion, the oscillator 16 terminates the operation of oscillation.

FIG. 4 is a detailed block diagram of the timer 14 of the embodiment of FIG. 1.

Referring to FIG. 4, the oscillator 16 is a ring oscillator and the counter 18 is a dividing counter.

Note that the oscillator 16 may not necessarily be a ring oscillator and may be replaced by a C-R oscillation circuit as illustrated in FIG. 5 or a crystal oscillator as shown in FIG. 6.

Then, the period of time of a timing operation of the timer 14, or the reset period of the system, may be modified by changing the oscillation frequency of the oscillator 16, or alternatively by changing the predetermined number to be count by the counter 18, or still alternatively by changing the divided number of the frequency in the dividing counter, if such a counter is used.

FIG. 7 is a block diagram of a non volatile semiconductor memory device incorporating a power-on reset system according to the invention. The memory device is constructed on a semiconductor substrate. A non-volatile semiconductor memory device such as an EEPROM intrinsically comprises a built-in oscillator and a built-in counter (designated respectively by reference numerals 16 and 18 in FIG. 7) that cooperate with a program control circuit. According to the present invention, a power-on reset system can be built in the memory device by utilizing these elements.

Referring to FIG. 7, a level "H" signal S1 generated by the one-shot pulse generator 10 of the system when the system is energized is applied to the set-input terminal S of the FF 12 and the reset-input terminal R of the counter 18. The FF 12 which is now set to operate supplies the OR-gate with a level "H" signal S2. Upon receiving the signal S2, the OR-gate transmits an enable signal S3 to the input terminal E of the oscillator 16, which by turn starts oscillating to generate an oscillation signal S. The generated oscillation signal S4 is fed to the counter 18 and, e.g., the frequency of the signal is divided by a given number to generate a frequency division signal S5. The frequency division signal S5 is sent to the reset-input terminal R of the FF 12 to turn the signal S2 to level "L" and stop the oscillation of the oscillator 16. Thus, a system reset signal is obtained by the signal S2.

To start writing a data on a memory cell of the device, the output signal of the program control circuit, or an program EN signal S6 is turned to level "H" and fed to the oscillator 16 by way of the OR-gate. Upon receiving the signal S3, the oscillator 16 starts oscillating. The oscillation signal S4 is then fed to the counter 18 to generate a frequency division signal S5. As soon as a given period of time is timed and the signal S5 turns from level "L" to level "H", the program control circuit turns the program EN signal S6 to level "L" to terminate the data writing operation.

As long as the program EN signal is held to level "H", the oscillation signal S4 is fed to the clock supply terminal CK of a voltage step-up circuit. The voltage step up circuit uses the oscillation signal S4 it receives by way of an AND-gate as a clock signal within the circuit to generate a stepped up potential signal S7 or for some other purpose. The stepped-up potential signal S7 generated by the voltage step up circuit is then fed to a level shift circuit disposed between a decoder and a non-volatile memory cell such as an EPROM or an EEPROM. The level of the decode signal transmitted from the decoder is shifted by a level shift circuit and then supplied to the memory cell typically by way of a word line so that consequently a data is written into the memory cell.

Thus, a power-on reset system according to the invention can be built by utilizing the oscillator 16 and other appropriate elements incorporated in a nonvolatile semiconductor memory device. With such an arrangement, only a flip-flop 12 needs to be added to the memory device, meaning a considerable reduction in the overall volume and the surface area of a memory device incorporating a power-on reset system if compared with any comparable conventional device.

Furthermore, considering the fact that a non-volatile memory device such as an EPROM or an EEPROM normally requires a relatively long reset period of approximately 1 msec when it is energized, it will be understood that a power-on reset system according to the present invention provides a remarkable advantage.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor memory device provided with a power-on reset system comprising:
   a flip-flop having a set input for receiving a set signal when a power supply voltage is initially supplied to the device, reset input, and a flip-flop output;
   oscillation means, having an enable input, for generating oscillation signals;
   counter means for sending a count-end signal to the reset input when the number of oscillation signals reaches a given number;
   voltage step-up means having an input responsive to the oscillation signals and an output for transmitting stepped up potential signals;
   control means, having an input responsive to the count-end signal, for generating an enable signal to write data into a memory cell of the device;
   a memory cell matrix;
   a decoder for transmitting a decoded signal;
   means coupled to the output of the voltage step-up means for shifting the level of the decoded signal and sending a shifted signal to the memory cell matrix;
   a first logic gate for forwarding the oscillation signals from the oscillation means to the voltage step-up means upon receiving the enable signal; and
   a second logic gate having a first input responsive to the flip-flop output, a second input responsive to the enable signal from the control means, and an output coupled to the enable input of the oscillation means.

2. The device according to claim 1 wherein the control means generates the enable signal for a period of time determined by the oscillation means and counter means.

3. The device according to claim 2, further comprising means for generating a pulse in response to a change in a power supply voltage, wherein said counter means is reset in response to the pulse.

4. The device according to claim 3, wherein said reset input of said counter means and said set input of said flip-flop are connected in parallel to the pulse generating means.

5. The device according to claim 2, wherein said counter means includes a dividing counter.

6. The device according to claim 2, wherein said oscillation means is selected from a group consisting of a ring oscillator, a crystal oscillation circuit and a CR oscillation circuit.

7. A semiconductor memory device provided with a power-on reset system comprising:
   a flip-flop having a set input for receiving a set signal when a power supply voltage is initially supplied to the device, reset input, and a flip-flop output;
   oscillation means, having an enable input, for generating oscillation signals;
   counter means for sending a count-end signal to the reset input when the number of oscillation signals reaches a given number;
   voltage step-up means having an input responsive to the oscillation signals and an output for transmitting stepped up potential signals;
   control means, having an input responsive to the count-end signal; for generating an enable signal to write data into a memory cell of the device;

a memory cell matrix;

a decoder for transmitting a decoded signal;

means coupled to the output of the voltage step-up means for shifting the level of the decoded signal and sending a shifted signal to the memory cell matrix;

a first logic gate for forwarding the oscillation signals from the oscillation means to the voltage step-up means upon receiving the enable signal; and a second logic gate having a first input responsive to the flip-flop output, a second input responsive to the enable signal from the control means, and an output coupled to the enable input of the oscillation means, wherein a system reset signal, which begins and ends when the flip-flop receives the set signal and the count-end signal, respectively, is extracted from the flip-flop output.

8. The device according to claim 7, wherein the control means generates the enable signal for a period of time determined by the oscillation means and counter means.

9. The device according to claim 8, further comprising means for generating a pulse in response to a change in a power supply voltage, wherein said counter means is reset in response to the pulse.

10. The device according to claim 9, wherein said reset input of said counter means and said set input of said flip-flop are connected in parallel to the pulse generating means.

11. The device according to claim 8, wherein said counter means includes a dividing counter.

12. The device according to claim 8, wherein said oscillation means is selected from a group consisting of a ring oscillator, a crystal oscillation circuit and a CR oscillation circuit.

* * * * *

UNITED STATES PATENT AND TRADEMARK OFFICE
CERTIFICATE OF CORRECTION

PATENT NO. : 5,343,085
DATED : August 30, 1994
INVENTOR(S) : Takuya FUJIMOTO et al It is certified that error appears in the above-indentified patent and that said Letters Patent is hereby corrected as shown below:

On the Title page, under item [19], and in item [75], change

"Fujimoro" to --Fujimoto--.

Signed and Sealed this

Second Day of May, 1995

Attest:

BRUCE LEHMAN

*Attesting Officer*     *Commissioner of Patents and Trademarks*